United States Patent [19]

Okabayashi

[11] Patent Number: 5,268,088

[45] Date of Patent: Dec. 7, 1993

[54] SIMPLIFIED METHOD FOR DIRECT ELECTROPLATING OF ACRYLIC OR EPOXY CONTAINING DIELECTRIC SUBSTRATES

[75] Inventor: Kiyoshi Okabayashi, Tokyo, Japan

[73] Assignee: Eric F. Harnden, Redland, Calif.

[21] Appl. No.: 828,609

[22] Filed: Jan. 31, 1992

Related U.S. Application Data

[63] Continuation-in-part of Ser. No. 806,875, Dec. 12, 1991.

[51] Int. Cl.⁵ ............................................. C25D 5/56
[52] U.S. Cl. .................................. 205/167; 205/187; 205/210; 205/924
[58] Field of Search ............... 205/164, 210, 924, 157, 205/164, 187, 210, 924, 167

[56] References Cited

U.S. PATENT DOCUMENTS

| | | | |
|---|---|---|---|
| 3,523,875 | 8/1970 | Minklei | 205/164 |
| 3,668,082 | 6/1972 | Elmore | 205/210 |
| 4,604,299 | 8/1986 | De Luca et al. | 427/98 |
| 4,969,979 | 11/1990 | Appelt et al. | 205/210 |
| 4,997,724 | 3/1991 | Suzuki et al. | 205/210 |

Primary Examiner—Donald R. Valentine
Assistant Examiner—Kishor Mayeka
Attorney, Agent, or Firm—Poms, Smith, Lande & Rose

[57] ABSTRACT

Improved methods for electroplating non-conducting substrates are disclosed utilizing aqueous alkali metal containing adhesion promoter solutions to enhance the surface deposition of colloidal metal activating catalysts to form conducting layers capable of direct electroplating. The adhesion promoter solutions contain sufficient alkali metal ions to deposit trace amounts of metal ions onto the substrate surface to be plated. Copper ions may be incorporated into the adhesion promoters to enhance this effect. These adhesion promoter solutions eliminate the swelling and related problems associated with the direct electroplating of acrylic and epoxy containing substrates. Following adhesion promoter treatment, the substrates are conditioned with a cleaner/conditioner solution and catalytically activated with a colloidal catalyst of palladium and tin forming a highly conductive catalytically treated surface which will support subsequent direct electroplating in conventional plating baths.

11 Claims, No Drawings

SIMPLIFIED METHOD FOR DIRECT ELECTROPLATING OF ACRYLIC OR EPOXY CONTAINING DIELECTRIC SUBSTRATES

REFERENCE TO RELATED APPLICATION

This application is a continuation-in-part of prior U.S. application Ser. No. 07/806,875, filed Dec. 12, 1991.

BACKGROUND OF THE INVENTION

1. Field of the Invention

The present invention is directed to improved methods for directly electroplating conducting metals onto nonconducting or dielectric base materials particularly those containing acrylic or epoxy compounds subject to swelling under traditional plating methodologies. More particularly, the present invention is directed to reduced cost, reduced toxicity, streamlined methods for directly electroplating metals onto the surfaces of nonconducting substrates without the need for preliminary electroless plating, strongly oxidizing or exotic adhesion promoters, exotic activation catalysts, conversion coatings, or conducting clips to initiate the propagation of plating metal. The methods of the present invention are particularly applicable to rigid/flex sandwich materials incorporating acrylic adhesives, epoxy matrix multi-wire circuits, multi-layer laminated circuit boards, copper clad substrates, molded circuitry, and non-clad substrates. Additionally, the methods of the present invention can be readily incorporated into pattern plating processes.

2. Description of the Prior Art

In the past decade a number of methods have been developed for "directly" electroplating metals onto the surfaces of non-metallic or dielectric substrates. Prior to these developments, non-metallic surfaces were typically metallized or plated by first making the surfaces catalytically receptive to electroless metal deposition by treatment with an activation catalyst (usually an acid suspension of palladium and tin salts) followed by treatment of the catalyzed surfaces in chemical plating baths. These electroless or chemical plating steps form a metal layer having a sufficient thickness to support subsequent electroplating steps which build a layer of electroplated metal having the desired thickness and conductivity. Unfortunately, these traditional multi-step electroless metal plating processes require careful monitoring by highly trained operators because of their use of formaldehyde, complexity and sensitivity to chemical changes in the various solutions and plating baths. In spite of this complexity and expense early electroless plating processes continue to be of use, particularly in the manufacture of printed circuit boards.

Subsequent efforts directed toward eliminating the complexity and expense associated with preliminary electroless plating steps have met with varied levels of success. For example, Morrissey et al., U.S. Pat. No. 4,683,036 report a method for directly electroplating non-metallic surfaces by forming a plurality of metallic sites on the surface to be plated, providing that surface with a connector electrode, exposing the metallized surface and at least a portion of the connector electrode to an electroplating bath incorporating plating metal and a variety of preferential deposition additives including dyes, surfactants, chelating agents, brighteners and leveling agents and applying an electric potential to the connector electrode and a counter electrode in the plating bath.

Though reportedly effective at the direct electroplating of metals onto nonconducting surfaces, the method of Morrissey et al. also requires its own careful monitoring and control of plating bath chemistry and plating potential in order to obtain uniform metallization. Moreover, to compensate for the lack of preliminary electroless metal layer Morrissey et al. rely on a wide variety of relatively toxic plating additives to achieve preferential metal deposition in their plating baths. These materials add to the complexity, toxicity and waste elimination expenses associated with such processes. Further, because the catalytically deposited discrete metallic sites are not sufficiently conductive to support direct electroplating on their own a conducting "connector electrode" is required in conjunction with the metallized surface to initiate plating.

Morrissey et al. also report it advantageous to further treat the catalytically activated surface with an acidic or strongly basic solution in order to remove tin from the treated surface prior to electroplating. As with earlier electroless plating methodologies, these acidic or strongly basic accelerating solutions add to the expense, toxicity, and disposal problems associated with these plating techniques.

In an analogous development, recent efforts at improving the speed and quality of metallic plating processes have utilized adhesion promoter solutions to enhance the catalytic activation of dielectric surfaces prior to chemical or electroplating. Typically, these adhesion promoters are formed of aqueous solutions containing compounds such as potassium permanganate. These solutions oxidize the substrate surfaces in a preliminary treatment step prior to catalytic activation with the precious metal/tin catalyst. Though successful for these purposes, as with the previously discussed accelerating solutions, these strongly oxidizing adhesion promoters are difficult to utilize and dispose of in a safe and environmentally conscious manner.

Additionally, many of the prior art adhesion promoter solutions and condition/cleaners chemically interact with acrylic or epoxy materials causing excessive swelling. Swelling of the substrate reduces catalyst adhesion and significantly degrades plating performance. For example, modern flexible circuit boards are now formed by sandwiching layers of flexible material, such as Kapton TM, with layers of rigid material, such as FR-4 or tetra-functional polyamide. Layers of these materials are attached to one another with an acrylic adhesive. However, this adhesive is subject to swelling and attack by the combination of known saline adhesion promoter solutions followed by treatment with the typical nonylphenol metallized cleaners. Similarly, modern multi-wire circuits are formed by laying insulated copper conductors in a matrix of epoxy. These materials also are subject to excessive swelling of the epoxy matrix in areas where the insulation has been removed to expose the copper conductor. Thus, modern direct plating technologies are of limited utility with these materials.

Accordingly, it is a principal object of the present invention to provide methods for directly electroplating dielectric substrates with high quality, uniform, conducting metal layers that are simple to operate, inexpensive, and relatively non-toxic. The methods of the present invention are particularly applicable to the production of flexible circuitry, multi-wire circuitry, acrylic and/or epoxy containing substrates, and printed circuit boards having copper clad conductive surfaces on opposite sides of an insulating dielectric substrate and connected by plated "through holes".

It is an additional object of the present invention to provide novel, low cost adhesion promoters that are non-hazardous, highly effective, and inexpensive to produce.

It is a further object of the present invention to provide methods for the direct electroplating of non-conducting substrates that are particularly well suited for utilization in modern pattern plating processes and, of equal importance, operate without the need for high plating current densities and correspondingly large "through hole" diameters.

It is a further additional object of the present invention to provide high quality treated dielectric substrates and directly plated dielectric substrates including rigid/flex materials and acrylic or epoxy containing materials.

SUMMARY OF THE INVENTION

Generally stated, these and other objectives are accomplished by the present invention through the utilization of reduced complexity, highly efficient, reduced toxicity direct electroplating processes incorporating novel alkaline adhesion promoter solutions in place of the strongly oxidizing adhesion promoters of the prior art.

Before proceeding further it should be emphasized that these simple alkaline adhesion promoter solutions are equally applicable to electroless plating as well. However, for purposes of explanation these solutions will be discussed in the context of direct electroplating techniques. Thus, in their broadest aspect, the direct electroplating methods of the present invention generally comprise the following steps.

First, a dielectric substrate to be plated is treated with an adhesion promoter solution formed of aqueous alkali metal such as KOH, NaOH, $Na_2CO_3$, $K_2CO_3$ or the like, alone or further including a non-semi-precious metal. Thus, in addition to eliminating the toxicity associated with prior art oxidizing adhesion promoters, the present invention also eliminates waste and substantially reduces the expense of direct electroplating processes relying on semi-precious metal adhesion promoters. This is followed by treatment with a cleaner or cleaner/conditioner solution which may be followed by an optional pre-dip treatment to prevent subsequent contamination of the following activation catalyst solution. The conditioned substrate is then treated with an activation catalyst, preferably a micro-fine colloidal dispersion of a noble or precious metal and tin in an aqueous salt solution such as that disclosed in U.S. Pat. No. 4,933,010 or any commercially available activation catalyst. The catalytically activated substrate is then rinsed in water in order to remove any excess catalyst remaining on the substrate surfaces.

The next step involves treatment of the activated substrate with a mildly basic accelerating solution, preferably containing copper ions as disclosed in co-pending, U.S. patent application Ser. No. 718,186, filed Jun. 20, 1991. Following acceleration the treated substrate may go directly to electroplating or, alternatively, may be stabilized in a sulfuric acid bath for storage or subsequent pattern plating treatment as known in the art.

In practice, the improved methods of the present invention function to produce a highly conductive catalytic metal layer that will support direct electroplating without the need for conversion coatings, conducting clips or other plating propagation techniques. For example, the average electrical resistance measured across a catalytically treated dielectric substrate "through hole" utilizing the methods of the prior art ranges from 10,000 to 30,000 ohms. In contrast, utilizing the methodology of the present invention the measured "through hole" resistance may be as low as 100 ohms. Thus, average electrical resistance measured from side to side on a multi-hole catalytically treated substrate can be as low as 0.2 ohms utilizing the methods of the present invention as opposed to the average of 500 ohms to $8 \times 10^7$ ohms through the methods of the prior art.

Based upon electrical conductivity alone, it is clear that the methods of the present invention produce significantly more dense, uniform and complete conducting catalytic layers which, as a result, greatly enhance the speed and quality of subsequent electroplated metal layers. These quality benefits are achieved in conjunction with the previously discussed reduction in toxicity and expense achieved through the methods of the present invention which eliminate caustic, strongly basic compounds and expensive semi-precious metals from the adhesion promoter solutions without sacrificing plating performance. Moreover, these novel adhesion promoters enable the methods of the present invention to be utilized in conjunction with acrylic and/or epoxy containing substrates which would react and swell in the presence of prior art adhesion promoter solutions.

It should be emphasized that while the micro-fine colloidal catalysts mentioned are preferred, the method of the present invention is suitable for use with any quality noble or precious metal colloidal catalyst. Similarly, a wide variety of commercially available cleaner/conditioner solutions may be utilized to practice the present invention. This broad based applicability makes the methods of the present invention and the associated adhesion promoter solutions readily adaptable to existing plating processes and equipment in addition to their unprecedented utility in connection with plating dielectric substrates where substrate swelling is critical.

Further objects, features and advantages of the present invention will become apparent to those skilled in the art from a consideration of the following detailed description.

DETAILED DESCRIPTION OF THE INVENTION

Those skilled in the art will appreciate that sensitizing activator solutions of catalytic noble or precious metals are used in a wide variety of electroless and direct electroplating metal techniques. Thus, in a broad aspect, the present invention provides methods for significantly enhancing the effectiveness, stability and durability of these sensitizing activator solutions to easily and effectively produce conducting catalytic layers on treated dielectric substrates which enables the treated substrates to be electroplated directly. Where prior art efforts have been focused on improving the catalyst itself or on subsequently treating the catalytically activated substrate surfaces to achieve these goals, the methods of the present invention advantageously pretreat the dielectric substrate surfaces to significantly improve the adhesion of the catalytic sensitizing activator thereby eliminating the need for costly and difficult subsequent treating steps. Thus, the present invention is able to produce previously unobtainable levels of conductivity in the conducting catalyst layers deposited on the dielectric substrates to be plated in a simple, efficient and inexpensive manner.

Of equal importance, the present invention accomplishes these results while simultaneously eliminating previously used toxic or hazardous materials such as formaldehyde and permanganate as well as eliminating the associated expenses. This is accomplished through its utilization of novel alkali metal adhesion promoters which enhance the adsorption and dispersion of cleaner conditioners on the surfaces of the dielectric substrates prior to treatment with the sensitizing activator. The alkali adhesion promoters are non-hazardous, easy to transport, easy to use, and safe to store. Because of their effectiveness and their ability to treat acrylic and/or epoxy containing substrates without swelling, the methods of the present invention provide improved, lower cost electroplating methodologies which are particularly well suited for utilization with rigid/flex circuitry and multi-wire circuits incorporating acrylic or epoxy-type materials in addition to being widely applicable to dielectric materials in general including printed circuit boards, functional and decorative plastic components.

Generally speaking, most sensitizing activator solutions rely upon a catalytic noble or precious metal halide salt such as palladium chloride in conjunction with tin chloride to chemically deposit a film of these materials on the surface of the dielectric substrates to be plated. Improvements in these sensitizing activator solutions have generally involved the elimination of acids which may attack the black copper oxide layers of printed circuit boards and in the production of microfine, uniform colloidal distributions of the catalytic particles to produce more uniform and complete catalytically deposited layers.

As mentioned previously, exemplary catalytic sensitizing activator solutions suitable for practicing the present invention are the general subject matter of the Inventor's prior U.S. Pat. No. 4,933,010. Methods for their utilization in direct electroplating also are disclosed and claimed in the Inventor's U.S. Pat. No. 5,071,517. Subsequent improvements to these methodologies are disclosed and claimed in the Inventor's co-pending U.S. patent application Ser. No. 718,186 filed Jun. 20, 1991, the subject matter of which are incorporated herein by reference.

Thus, while a wide variety of known activating catalyst solutions may be utilized to practice the present invention, a preferred exemplary catalyst solution is formed as follows. Preferably, a non-acidic saturated aqueous salt solution of sodium chloride or alternative halide salt will be divided into two portions. An effective amount of a noble or precious metal salt such as palladium chloride will be dissolved in the first portion and a relative molar excess of stannous chloride or other halide salt will be dissolved in the second portion. The two solutions so produced are combined and reduced in volume to form a supersaturated concentrate of highly dispersed, uniform, stable micro-fine colloidal particles.

More specifically, to form the initial saturated aqueous salt solution approximately 1 Kg of sodium chloride is added to 3 liters of water and heated to approximately 60° C. to form a saturated salt solution. Next, 1 Kg of stannous chloride crystals are mixed with a sufficient volume of this saturated salt solution to form 1.9 liters. If necessary, this solution may be heated to approximately 20° C. to 30° C. with occasional stirring to achieve complete dissolution. In a separate container, 20 g of powered palladium chloride is added to 200 ml of the saturated salt solution. This solution is heated and stirred at a temperature between about 40° C. to 60° C. until complete dissolution of the palladium chloride is achieved. The dissolved palladium chloride salt solution is added to the stannous chloride salt solution with stirring and heat to raise the temperature to approximately 80° C.. This temperature is maintained for approximately 1 hour to evaporate anywhere from 5% to 10% of the solution to create a supersaturated solution. This produces approximately two liters of micro-fine colloidal sensitizing activator.

It again should be emphasized that alternative catalytic solutions are contemplated for use within the scope of the present invention. For example, an aromatic aldehyde such as lignin vanillin may be incorporated into the catalyst solution to prevent the palladium/tin colloids from agglomerating or coagulating and to enhance the adsorption characteristics of the solution. Alternatively, effective commercially available catalysts are available from MacDermid, Shipley, M&T Harshaw, and Enthone OMI as well as others.

The micro-fine catalytic colloidal solutions are preferably diluted prior to use as known in the art. Exemplary dilution factors range from approximately 10 to 1 to 30 to 1. Preferably, the previously discussed microfine catalytic colloidal solution will be diluted on the order of 10 to 1 in saturated salt solution. While no other additives or stabilizers are needed a small amount of HCl (approximately 4 ml) or $H_2SO_4$ (approximately 0.5 ml) may be added to prevent the formation of an oxidized tin layer on the surface of the solution.

Utilizing the exemplary or substantially equivalent catalytic sensitizing activator solutions, the methods of the present invention generally include the following steps. First, a suitable dielectric substrate is prepared for plating. For example, typical non-conducting substrate materials known in the art which are suitable for use in conjunction with the present invention include plastics, resins, acrylic and epoxy materials such as the glass fiber filled epoxy substrates commonly used in the manufacture of printed circuit boards or the rigid/flex laminated sandwich materials used in modern flexible circuitry or multi-wire epoxy matrix circuits. As known in the art, it is preferred that the non-conducting substrates be clean and free of rough edges.

The exemplary substrate is then treated with an aqueous alkali metal adhesion promoter (which may include additional metal ions capable of depositing on the substrate) in accordance with the teachings of the present invention. Preferably, the aqueous adhesion promoter solution will be formed from non-halide alkali metal salts including KOH, NaOH, $Na_2CO_3$, $K_2CO_3$ and the like. In accordance with the teachings of the present invention, any aqueous solution capable of depositing trace amounts of metal ions on the substrate surface will improve the subsequent adsorption of the cleaner/conditioner, thereby improving the adsorption of catalyzing activator and the resultant conductivity of the catalytically treated surface. Thus, an exemplary aqueous alkali adhesion promoter solution may be made by dissolving 150 g $Na_2CO_3$ with 150 g $K_2CO_3$ in sufficient distilled or deionized water to make one liter of solution. While this solution will operate effectively as an adhesion promoter that will not chemically interact with acrylic or epoxy surfaces, a further improvement in subsequent conductivity measurements is obtained by adding from 2 to 4 ml of a solution made by dissolving 100 g $CuSO_4.5H_2O$ in one liter of 10% by volume $H_2SO_4$.

As will be seen from the following discussion, this alternative copper containing solution is essentially identical to the accelerator solution used in subsequent steps in the method of the present invention. Whether or not additional metal ions are added to the aqueous alkali metal adhesion promoter solution, in operation the exemplary adhesion promoter solution is heated to 60° C. and the substrate to be treated is immersed in the solution for approximately five minutes prior to the following cleaner/conditioner step. However, it should be emphasized that these temperatures and times are exemplary only and that the adhesion promoter bath so produced is extremely stable and operates over a wide range of temperatures and treatment times.

Additionally, in accordance with the teachings of the present invention, because the alkaline adhesion promoter solution is substantially identical to the accelerator solution in constituent composition and lacks precious or semi-precious metal ions the overall operating cost of the process is significantly reduced with no loss in plating quality even relative to the Inventor's own previously discussed saline adhesion promoter technology. Regardless of how the adhesion promoter solution is produced, treatment of the substrate simply involves immersing the substrate into the solution with agitation at room temperatures or above for a period of time ranging from approximately 1 to 10 minutes, preferably followed by a brief rinse with distilled or deionized water.

In contrast to the strongly oxidizing prior art adhesion promoters which reportedly functioned to chemically expose clean substrate surfaces for conditioning, the gentle, non-toxic alkali metal and/or metal ion containing aqueous adhesion promoters of the present invention are believed to function by adsorbing trace amounts of the metal ions onto the substrate surfaces prior to conditioning to enhance the subsequent deposition of the cleaner/conditioner. This treatment significantly improves the operation of the cleaner/conditioner and, as a result, enhances the adsorption of the subsequently deposited catalytic activator. This in turn, significantly improves the conductivity of the deposited catalytic film beyond that of prior art adhesion promoters. Additionally, as previously mentioned, the alkali metal adhesion promoters of the present invention are safe, simple and easy to use, transport and store because of their relatively low toxicity and do not swell acrylic or epoxy materials.

Thus, the next step following adhesion promotion involves taking the adhesion promoted substrate and treating it with a conditioner solution, also known as a cleaner/conditioner. A wide variety of cleaner/conditioner agents and solutions known in the art are suitable for practicing the present invention. Exemplary conditioners are available from Shipley, Lion Chemical Company Ltd. of Japan and M&T Harshaw. The cleaners function to remove any light oxide layers and contaminates such as finger prints from the surface of the dielectric substrate and function as surfactants which adhere to the surfaces of the substrates. Reportedly, they slightly solubilize the catalytic colloids in the subsequent steps, attracting the colloidal particles to the surfaces of the substrate, thereby encouraging the colloids to adsorb more readily onto the treated substrate surfaces.

As with the previous adhesion promoter treatment step, treatment with the cleaner/conditioner simply involves immersion of the substrate into a solution of the cleaner/conditioner with agitation at room temperature or above for a period of up to 10 minutes followed by a 2 minute rinse in distilled or deionized water.

If desired, the methods of the present invention again differ from those of the prior art by manipulating the cleaner/conditioner step with a unique salt water rinse technique. This alternative methodology functions to prevent excessive removal of the cleaner/conditioner from the surfaces of the treated substrate. In some circumstances this step is so effective at enhancing catalytic deposition that it is possible to practice the method of the present invention without utilizing the previously discussed adhesion promoter step, as long as the cleaner/conditioner is properly treated. Thus, rather than rinsing the cleaner/conditioner treated substrates with distilled or deionized water, in accordance with the teachings of the present invention the substrates may be rinsed in a 10% by weight NaCl solution which is less effective at removing the cleaner/conditioner. This simple manipulation of the cleaner/conditioner step unexpectedly increases the adsorption of the colloidal catalyst.

However, it should be noted that when practiced in conjunction with acrylic or epoxy containing materials the utilization of readily available cleaner/conditioner solutions and saline rinses may result in undesirable substrate swelling. Even where special low temperature metasilicate cleaners are utilized to avoid swelling of the acrylic or epoxy material the utilization of saline solution may not be desirable. Thus, simple rinsing in distilled or deionized water may be effective following the cleaner/conditioner treatment.

The next step in the present invention is to immerse the conditioned substrates in a pre-dip solution to avoid contamination of the subsequent catalyst bath. It should be noted, that this pre-dip step is not essential to the practice of the present invention but is preferable as it enhances the longevity of the catalyst solution. Preferably, the pre-dip solution will be substantially identical to the carrier solution for the colloidal catalyst, absent the colloidal materials. Thus, where desired, the processing sequence may involve immersion of the substrates in a catalyst pre-dip solution comprising an aqueous salt solution compatible with the catalytic solution such as a dilute NaCl solution incorporating a small concentration of vanillin.

This pre-dip solution prevents contamination of the catalyst by rinse water or other solutions which may cling to the surfaces of the substrate or "through holes" to be catalytically treated. As an added benefit, the presence of vanillin in the pre-dip promotes improved adsorption of the micro-fine colloidal catalyst particles by initiating a partial polarization of the substrate surfaces. Preferably, immersion in the pre-dip solution will take place with agitation at room temperature for a brief period without a following rinse.

The next step involves immersion of the treated substrate with agitation at room temperature or an elevated temperature in the previously discussed sensitizing activator colloidal catalyst solution for a period ranging from approximately 5 to 10 minutes. An exemplary catalytic treatment step in accordance with the teachings of the present invention will utilize the previously discussed catalyst, or its equivalent, at a temperature varying between approximately 35° C. to 55° C. for approximately 7 minutes. This produces a very uniform layer of deposited colloidal material of considerably higher density and electrical conductivity than previously obtainable through prior art methodologies.

The more uniform, dense layer of catalytic colloid so produced preferably is accelerated using an alkaline copper accelerator as taught in the Inventor's co-pending U.S. patent application Ser. No. 718,186, filed Jun. 20, 1991 to form a more highly conductive catalytic metal film. As noted above, the preferred accelerator solutions for use in conjunction with the present invention are the same as those utilized in the adhesion promoter step. For example, exemplary mildly basic accelerating solutions can be formed by dissolving anywhere from 50 g to 400 g of alkaline salts such as NaOH, KOH, $Na_2CO_3$, or $K_2CO_3$ per liter of distilled water. Then, to each liter of this solution approximately 2 ml of copper ion containing solution formed by dissolving approximately 100 g of $CuSO_4$ in one liter of 10% $H_2SO_4$ is added. Similar concentrations may be utilized to produce the alkali adhesion promoter solutions. Treatment of the catalyzed substrate simply involves immersion in a bath of the accelerator solution with agitation and at an elevated temperature of approximately 50° C. for a period of approximately 10 minutes. Following acceleration the substrate should be rinsed with distilled or deionized water for 1 or 2 minutes.

If desired, the accelerated substrate can be stabilized through immersion with agitation at room temperature in a 10% by volume aqueous solution of $H_2SO_4$ for approximately 3 minutes followed by a 2 minute rinse with distilled or deionized water and air drying. Other acids such as methane sulfonic acid may be used for this purpose as well. Though not essential to the practice of the present invention, this acid bath will stabilize the substrate by hardening the catalyst layer and preventing its subsequent oxidation. After stabilization the treated substrates can be manipulated and stored for considerable periods of time without difficulty. Nonetheless, it should be emphasized that sulfuric acid stabilization is an alternative step and is not essential to the practice of the present invention.

As previously noted, the method of the present invention produces relatively highly conductive deposited layers of micro-fine catalytic colloidal metal which can be directly electroplated with a layer of conducting metal without the need for conventional electroless plating, conversion coatings or plating solution additives. Additionally, electroplating current densities can be reduced in accordance with the teachings of the present invention which enhances the quality of the metal plating.

Thus, following acceleration the treated substrate may be plated using a simple plating solution without the need for solution additives. This puts a softer copper deposit on the electroplated substrate.

An exemplary plating solution can be produced by dissolving 80 g copper sulfate with 180 g of sulfuric acid and 30 mg chlorine into each liter of distilled or deionized water. This produces a typical copper electroplating solution comprising an aqueous acid solution of the metal to be plated. Naturally, the present invention is applicable to metals other than copper as known in the art.

As an added benefit of the resultant reduced current densities needed to conduct metal plating of these treated substrates, the substrates produced by the present invention may have unusually small "through hole" diameters without sacrificing plating quality or conductivity. In all other aspects electroplating the treated substrates of the present invention is generally conventional. Thus, the exemplary plating baths can be maintained at temperatures ranging from approximately 25° C. to 30° C. Further, electroplating should be continued for a sufficient period of time to deposit the desired thickness of plating metal, typically ranging from approximately 0.5 mils to 2.0 mils. Plating times ranging from several minutes to over 1 hour are usually sufficient.

A further understanding of the present invention will be provided to those skilled in the art from a consideration of the following non-limiting examples. These examples were designed to illustrate the competitive advantages of the methods of the present invention over those of the prior art. In the initial examples four-layer polyamide circuit board material was utilized. Each sample had 100 through holes of approximately 1 mm diameter drilled through it followed by a desmearing process consisting of immersion in a heated bath of concentrated sulfuric acid and hydrogen peroxide. Each specimen was cut to a standard size measuring 2.5 cm by 5.0 cm and approximately 2 mm in thickness. Edges were polished to produce a relatively uniform smoothness.

EXAMPLE 1

Direct Plating a Copper Clad Multi-Layer Circuit Board Using Prior Art Strongly Alkaline, Strong Oxidizer Adhesion Promoter and Highly Chelated Cleaner Conditioner In order to provide a baseline comparison of the prior art methodologies for direct plating four specimens were treated using the following basic procedure of consecutive steps.

Step 1. Each sample was immersed with agitation at room temperature for 2 minuts in an adhesion promoter solution formed of 30 g $KMNO_4$ with 20 g NaOH per liter in deionized water followed by a 2 minute rinse in running deionized water.

Step 2. Each sample was immersed with agitation for 10 minutes in a cleaner/conditioner solution of Shipley 1175A cleaner conditioner at 4% concentration and heated to 80° C. for 10 minutes followed by a 2 minute rinse in running deionized water.

Step 3. Each sample was immersed with agitation at room temperature in a pre-dip solution of saturated NaCl in water including 1 g vanillin and 4 ml HCl per liter with no subsequent rinsing.

Step 4. Each sample was immersed with agitation for 7 minutes in a colloidal catalyst formed from Solution Technology Systems HN504 TM Acid-Free TM catalyst at 5% concentration using a carrier solution of the same composition as the pre-dip described in Step 3 and heated to 40° C. followed by a 2 minute rinse with deionized water.

Step 5. Each sample was immersed with agitation for 10 minutes in an alkaline accelerator solution formed of Solution Technology System HN505.1 TM consisting of a mixture of $Na_2CO_3$ and $K_2CO_3$ in deionized water including 4 ml of Solution Technology Systems HN505.2 TM Kick-Start TM as a source of copper ions and heated to 58° C. followed by a 2 minute rinse in deionized water.

Step 6. Each sample was immersed with agitation at room temperature for 3 minutes in a 10% by volume sulfuric acid bath followed by a 2 minute rinse with deionized water and air drying.

Step 7. The resistance was measured for each specimen by placing one probe of an ohm meter on the copper foil of one side of each specimen and the other probe on the foil of the opposite side. The average resistance value for each specimen was measured at 2,000 ohms per "through hole".

Step 8. Each specimen was plated for 1 hour using a simple copper sulfate bath as described above at 2 amps per square decimeter. Surface coverage was observed to be complete after 10 seconds with no observable voids and all edges completely plated.

EXAMPLE 2

Direct Plating Copper Clad Multi-Layer Circuit Board Using Prior Art Strongly Alkaline, Strong Oxidizer Adhesion Promoter and Mildly Chelated Cleaner Conditioner To provide an additional prior art baseline comparison four specimens were treated using the same procedure as in Example 1 with the following modifications to the indicated steps and associated results.

Step 2. The cleaner/conditioner was made up at 4% concentration from Laol condition produced by Lion Chemical Co. Ltd.

Step 7. The average resistance was measured per "through hole" at 1,863 ohms.

Step 8. The specimens were plated under the same conditions as in Example 1 and surface coverage was observed to be complete after 10 seconds with no observable voids.

EXAMPLE 3

Direct Plating Copper Clad Multi-Layer Circuit Board Using Prior Art Strongly Alkaline, Strong Oxidizer Adhesion Promoter and Relatively Weak Cleaner Conditioner To provide an additional prior art baseline comparison four were treated using the same procedure as in Example 1 with the following modifications to the indicated steps and associated results.

Step 2. The cleaner/conditioner was made up at 4% concentration from M&T Harshaw's CC350.

Step 7. The average resistance was measured per "through hole" at 8,000 ohms.

Step 8. The specimens were plated under the same conditions and surface coverage was observed to be complete after 35 seconds. Voids were observable on glass bundles projecting into the through holes and unplated areas were present on the specimen edges.

EXAMPLE 4

Direct Plating Copper Clad Multi-Layer Circuit Board Using Prior Art Strongly Alkaline, Strong Oxidizer Adhesion Promoter with a Highly Chelated Cleaner Conditioner and Followed by a Salt Water Rinse In order to illustrate the ability of the methods of the present invention to increase the adsorption of catalyst through manipulation of the cleaner/conditioner step with a novel salt water rinse, four additional specimens were treated as in Example 1 with the following modifications to the indicated steps and associated results.

Step 2. Following immersion in the Shipley 1175A cleaner/conditioner the specimens were rinsed in a 10% by weight NaCl solution instead of deionized water.

Step 7. The average resistance was measured per "through hole" at 150 ohms.

Step 8. The specimens were plated under the same conditions and surface coverage was observed to be complete after 5 seconds with no observable voids and all edges completely plated.

EXAMPLE 5

Direct Plating Copper Clad Multi-Layer Circuit Board Using Saline Adhesion Promoter and Prior Art Highly Chelated Cleaner Conditioner In order to provide additional baseline illustrating the superior performance achieved through the method of the present invention relative to the Inventor's earlier saline adhesion promoter solutions an additional four specimens were treated using the methodology of Example 1 with the following modifications to the indicated steps and associated results.

Step 1. The adhesion promoter comprised a 1% solution of the catalyst from Step 4 diluted using a carrier solution equivalent to the pre-dip of Step 3. The bath was not heated.

Step 7. The average resistance was measured per "through hole" at 900 ohms.

Step 8. The specimens were plated under the same conditions and surface coverage was observed to be complete after 5 seconds with no observable voids.

EXAMPLE 6

Direct Plating Copper Clad Multi-Layer Circuit Board Using Saline Adhesion Promoter and Mildly Chelated Cleaner Conditioner In order to provide additional baseline illustrating the superior performance achieved through the method of the present invention, four additional specimens were treated as in Example 2 with the following modifications to the indicated steps and associated results.

Step 1. The adhesion promoter comprised a 1% solution of the catalyst from Step 4 diluted using a carrier solution equivalent to the pre-dip of Step 3. The bath was not heated.

Step 7. The average resistance was measured per "through hole" at 770 ohms.

Step 8. The specimens were plated under the same conditions and surface coverage was observed to be complete after 2 seconds with no observable voids.

EXAMPLE 7

Direct Plating Copper Clad Multi-Layer Circuit Board Using Saline Adhesion Promoter and Relatively Weak Cleaner Conditioner In order to provide additional baseline illustrating the superior performance achieved through the method of the present invention, four additional specimens were treated as in Example 3 with the following modifications to the indicated steps and associated results.

Step 1. The adhesion promoter comprised a 1% solution of the catalyst from Step 4 diluted using a carrier solution equivalent to the pre-dip of Step 3. The bath was not heated.

Step 7. The average resistance was measured per "through hole" at 1,340 ohms.

Step 8. The specimens were plated under the same conditions and surface coverage was observed to be complete after 10 seconds with no observable voids.

EXAMPLE 8

Direct Plating Copper Clad Multi-Layer Circuit Board Using Saline Adhesion Promoter and Mildly Chelated Cleaner Conditioner Followed by Salt Water Rinse In order to provide additional baseline illustrating the superior performance achieved through the method of the present invention, four additional specimens were treated as in Example 4 with the following modifications to the indicated steps and associated results.

Step 1. The adhesion promoter comprised a 1% solution of the catalyst from Step 4 diluted using a carrier solution equivalent to the pre-dip of Step 3. The bath was not heated.

Step 7. The average resistance was measured per "through hole" at 120 ohms.

Step 8. The specimens were plated under the same conditions and surface coverage was observed to be complete after 2.5 seconds with no observable voids.

EXAMPLE 9

Direct Plating an Unclad ABS Plastic Plaque Using Saline Adhesion Promoter and Highly Chelated Cleaner Conditioner In order to provide additional baseline illustrating the superior performance achieved through the method of the present invention, four ABS plastic plaques measuring 5 cm × 10 cm and approximately 3 mm thick were treated as described in Example 5, with the following modifications to steps 1 and 2.

Step 1. Immersion in the adhesion promoter solution was preceded by etching the plastic in a mixture of chrome/sulfuric acid to form a slightly roughened surface for the plated metal to adhere to.

Step 2. The cleaner/conditioner bath was heated to only 70° C. to avoid malformation of the plastic from excessive heat.

The remaining process step were identical to those of Example 1 with the following results.

Step 7. The average resistance measured 1,020 ohms from side to side.

Step 8. The plaques were plated under the same conditions as Example 1 and initial coverage was completed in less than 25 seconds with no voids.

Each of the foregoing examples illustrates the average resistance or conductivity obtained through prior art direct plating methodologies utilized in conjunction with rigid dielectric substrates. As such they provide a comparative baseline for the significantly improved conductivity achieved through the methods of the present invention illustrated in the following examples. Moreover, the following examples also illustrate the operability of the methods of the present invention in conjunction with flexible circuitry. In the first two examples test coupons were made of two materials; one set of rigid/flex Kapton and FR-4 and one set of four-layer polymide. Each set was made of individual samples measuring approximately 2.5cm × 5.0 cm × 2 mm with 100 through holes approximately 1 mm in diameter.

EXAMPLE 10

Direct Plating of Swellable Substrates Using Prior Art Strongly Alkaline Adhesion Promoter and Highly Chelated Cleaner Conditioner In order to illustrate the problem associated with using prior art methods for swellable substrates four test coupons were made using rigid/flex, Kapton and FR4 material with an acrylic adhesive. Each coupon measured approximately 2.5 cm × 5.0 cm × 2 mm with 100 holes approximately 1 mm in diameter. Each specimen was treated as in Example 1 with the following results observed.

Step 7. The average resistance was 17,400 ohms per "through hole" (presumed to result from some areas of effective treatment on the edges of the coupons as the through holes did not plate as described in Step 8).

Step 8. After several minutes some patchy plating appeared on the edges and in some through holes. After one hour, the majority of holes remained unplated. Several holes did plate but displayed very irregular plating. Subsequent cross sections revealed that the adhesive layers had swelled and the catalyst had failed to remain adsorbed.

EXAMPLE 11

Direct Plating of Swellable Dielectric Substrates Using Sodium Carbonate Alkali Metal Adhesion Promoter To illustrate the effectiveness of the present invention in plating such materials, additional swellable substrate test coupons were treated as follows.

Step 1. Two of each type of coupon were immersed with agitation at 60° C. for 5 minutes in a solution formed of 300 g of $Na_2CO_3$ per liter of deionized water followed by a 1 minute rinse in running deionized water.

Step 2. Each sample was immersed with agitation for 10 minutes in a conditioner/cleaner of metasilicates and ethoxylated nonylphenol surfactants at a 6% concentration and heated to 76° C. for 10 minutes followed by a 1 minute rinse in running deionized water.

Step 3. Each sample was immersed with agitation in a pre-dip solution of saturated NaCl in deionized water, including 1 g vanillin and 4 ml HCl per liter with no subsequent rinse.

Step 4. Each sample was immersed in a colloidal catalyst formed from Solution Technology Systems HN504 TM Acid-Free TM Catalyst at 5% concentration in a carrier solution of the same composition as the pre-dip of Step 3 and heated to 40° C. followed by a 1 minute rinse in running deionized water.

Step 5. Each sample was immersed with agitation for 10 minutes in an alkaline accelerator solution formed of Solution Technology Systems HN505.1 TM consisting of a mixture of $Na_2CO_3$ and $K_2CO_3$ in deionized water including 4 ml of Solution Technology Systems HN505.2 TM Kick-Start TM as a source of copper ions and heated to 58° C. followed by a 1 minute rinse in running deionized water.

Step 6. Each sample was immersed with agitation at room temperature for 3 minutes in a 10% by volume sulfuric acid bath followed by a 2 minute rinse with running deionized water and air drying.

Step 7. The resistance was measured for each specimen by placing one probe of an ohm meter on the copper foil of one side of each specimen and the other probe on the foil of the opposite side. The average resistance value for each specimen was measured at 1,500 ohms per through hole.

Step 8. Each specimen was plated for 1 hour using a simple copper sulfate bath at 2 amps per square decimeter. Surface coverage in the through holes was observed to be complete after 10 seconds with no observable voids and all edges completely plated. Plating in the holes was smooth.

EXAMPLE 12

Direct Plating of Swellable Dielectric Substrate Materials with Sodium Carbonate and Potassium Carbonate with Added Copper Ions as an Adhesion Promoter To further illustrate the impact of adding additional metal ions to the adhesion promoter solutions of the present invention, four additional specimens were treated as in Example 10 with the following modifications to the indicated steps and associated results.

Step 1. Each sample was immersed with agitation for 5 minutes in an alkaline accelerator solution formed of Solution Technology Systems HN505. TM consisting of a mixture of $Na_2CO_3$ and $K_2CO_3$ in deionized water including 4 ml of Solution Technology Systems HN505.2 TM Kick-Start as a source of copper ions and heated to 60° C. followed by a 1 minute rinse in running deionized water.

Step 7. The average resistance was measured at 450 ohms per through hole.

Step 8. Through hole surfaces were observed to be completely covered in less than 5 seconds.

EXAMPLE 13

Direct Plating an Unclad ABS Plastic Plaque Using Sodium Carbonate and Potassium Carbonate with Added Copper Ions as Adhesion Promoter To further illustrate the applicability of the methods of the present invention to plating a variety of substrates, including non-clad plastics, four ABS plastic plaques measuring 5 cm×10 cm and approximately 3 mm thick were treated as described in Example 11, with the following modifications to the indicated steps and associated results.

Step 1. Immersion in the adhesion promoter solution was preceded by etching the plastic in a mixture of chrome/sulfuric acid to form a slightly roughened surface for the plated metal to adhere to.

Step 2. The conditioner/cleaner bath, made from a 5% concentration of Shipley 1175A, was heated to only 70° C. to avoid malformation of the plastic from excessive heat.

Step 7. The average resistance measured 750 ohms from side to side.

Step 8. The plaques were plated under the same conditions as in Example 2 and initial coverage was completed in less than 25 seconds with no voids.

EXAMPLE 14

Direct Plating of Swellable Dielectric Substrate Material Using Prior Art Saline Adhesion Promoters To illustrate that the effective results of Example 12 were not solely dependant upon the use of the metasilicate cleaner conditioner but upon use of sodium carbonate and potassium carbonate with added copper ions, four additional specimens were treated as in Example 12 with the following modifications to the indicated steps and associated results.

Step 1. Each sample was immersed in a saline adhesion promoter as described in Example 5.

Step 7. The average resistance was 25,300 ohms per through hole.

Step 8. After one hour only sporadic traces of plating appeared on the edges of the boards. No through holes were plated. It was apparent that there was an incompatibility between the saline adhesion promoter described in Example 5 and the metasilicate cleaner conditioner of Example 12 that produced these results.

It is apparent that while the saline adhesion promoter of the Inventor's parent application provided improvements for most plating applications it was limited with respect to use with cleaner conditioners which would not swell acrylic or epoxy. The foregoing comparative examples demonstrate that the present invention overcomes those limitations while unexpectedly providing improved results on nonswellable materials.

Having thus described the exemplary embodiments of the present invention, it should be noted by those skilled in the art that the disclosures herein are exemplary only and that alternatives, adaptations, and modifications may be made within the scope of the present invention. Accordingly, the present invention is not limited to the specific embodiments illustrated herein.

What is claimed is:

1. An improved, reduced cost method for directly electroplating a metal onto a surface of a non-conducting polymer substrate, said method comprising the steps of:

treating said surface with an aqueous adhesion promoter solution including a non-oxidizing alkali metal compound present in an amount sufficient to deposit alkali metal ions on said surface;

subsequently conditioning said treated surface with a cleaner/conditioner solution;

treating said condition surface with a colloidal metal catalyst to deposit a substantially uniform, conducting layer colloidal metal; and passing a current between two electrodes immersed in an electrolyte containing dissolved plating metal, one of said electrodes being said catalytically treated substrate.

2. The method of claim 1 wherein said aqueous adhesion promotor solution is an aqueous solution including from approximately 50 grams per liter to approximately 400 grams per liter of at least one alkali metal compound selected from the group consisting of NaOH, KOH, $Na_2CO_3$, and $K_2CO_3$.

3. The method of claim 2 wherein said aqueous adhesion promotor solution further includes a dilute concentration of copper ions.

4. The method of claim 1 further comprising the additional step of accelerating said catalytically treated surface with a mildly basic aqueous accelerating solution including a concentration of plating metal ions.

5. An improved, reduced cost method for preparing the surfaces of a non-conducting polymer substrate for metal plating, said method comprising the steps of:

treating said surface with an aqueous adhesion promotor solution including a non-oxidizing alkali metal compound present in an amount sufficient to deposit alkali metal ions on said surface;

subsequently conditioning said treated surface with a cleaner/conditioner solution; and treated said conditioned surface with a colloidal metal catalyst to deposit a substantially uniform, conducting layer of colloidal metal.

6. The method of claim 5 wherein said aqueous adhesion promotor solution is an aqueous solution including from approximately 50 grams per liter to approximately 400 grams per liter of at least one alkali metal compound selected from the group consisting of NaOH, KOH, $Na_2CO_3$, and $K_2CO_3$.

7. The method of claim 6 wherein said aqueous alkali adhesion promoter solution further includes a dilute concentration of copper ions.

8. The method of claim 1 wherein said non-conducting polymer substrate is a member selected from the group consisting of acrylic and epoxy substrates.

9. The method of claim 3 wherein said non-conducting polymer substrate is a member selected from the group consisting of acrylic and epoxy substrates.

10. The method of claim 5 wherein said non-conducting polymer substrate is a member selected from the group consisting of acrylic and epoxy substrates.

11. The method of claim 7 wherein said non-conducting polymer substrate is a member selected from the group consisting of acrylic and epoxy substrates.

* * * * *